US012692413B2

(12) United States Patent
Ballesteros et al.

(10) Patent No.: US 12,692,413 B2
(45) Date of Patent: Jul. 28, 2026

(54) POLISHING COMPOSITIONS AND METHODS OF USE THEREOF

(71) Applicant: Fujifilm Electronic Materials U.S.A., Inc., N. Kingstown, RI (US)

(72) Inventors: Carl Ballesteros, San Tan Valley, AZ (US); Hyosang Lee, Chandler, AZ (US)

(73) Assignee: Fujifilm Electronic Materials U.S.A., Inc., N. Kingstown, RI (US)

( * ) Notice: Subject to any disclaimer, the term of this patent is extended or adjusted under 35 U.S.C. 154(b) by 287 days.

(21) Appl. No.: 18/216,289

(22) Filed: Jun. 29, 2023

(65) Prior Publication Data

US 2024/0002696 A1      Jan. 4, 2024

Related U.S. Application Data

(60) Provisional application No. 63/357,095, filed on Jun. 30, 2022.

(51) Int. Cl.
*C09G 1/02*          (2006.01)
*B01J 35/27*         (2024.01)
*B01J 35/39*         (2024.01)
*H10P 52/40*         (2026.01)

(52) U.S. Cl.
CPC ................ *C09G 1/02* (2013.01); *B01J 35/27* (2024.01); *B01J 35/39* (2024.01); *H10P 52/403* (2026.01)

(58) Field of Classification Search
None
See application file for complete search history.

(56) References Cited

U.S. PATENT DOCUMENTS

| | | | | |
|---|---|---|---|---|
| 2011/0065364 A1* | 3/2011 | Carter | ..................... | C09G 1/02 451/41 |
| 2012/0270400 A1* | 10/2012 | Takegoshi | ............. | H10P 95/062 438/692 |
| 2023/0095372 A1* | 3/2023 | Gianetti | ............... | C07D 401/06 546/9 |

\* cited by examiner

*Primary Examiner* — Roberts P Culbert
(74) *Attorney, Agent, or Firm* — Fish & Richardson P.C.

(57)          ABSTRACT

This disclosure relates to polishing compositions containing at least one abrasive, at least one organic photocatalyst, and water.

19 Claims, No Drawings

POLISHING COMPOSITIONS AND METHODS OF USE THEREOF

CROSS-REFERENCE TO RELATED APPLICATION

The present application claims priority to U.S. Provisional Application Ser. No. 63/357,095, filed on Jun. 30, 2022, the contents of which are hereby incorporated by reference in their entirety.

BACKGROUND

The semiconductor industry is continually driven to improve chip performance by further miniaturization of devices through process and integration innovations. Chemical Mechanical Polishing/Planarization (CMP) is a powerful technology as it makes many complex integration schemes at the transistor level possible, thereby facilitating increased chip density.

CMP is a process used to planarize/flatten a wafer surface by removing material using abrasion-based physical processes concurrently with surface-based chemical reactions. In general, a CMP process involves applying a CMP slurry (aqueous chemical formulation) to a wafer surface while contacting the wafer surface with a polishing pad and moving the polishing pad in relation to the wafer. Slurries typically include an abrasive component and dissolved chemical components, which can vary significantly depending upon the materials (e.g., metals, metal oxides, metal nitrides, dielectric materials such as silicon oxide, silicon nitride, etc.) present on the wafer that will be interacting with the slurry and the polishing pad during the CMP process.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

As defined herein, unless otherwise noted, all percentages expressed should be understood to be percentages by weight to the total weight of a polishing composition.

In one aspect, this disclosure features a polishing composition that includes at least one abrasive, at least one organic photocatalyst; and water.

In another aspect, this disclosure features a method that includes applying a polishing composition described herein to a substrate, and bringing a pad into contact with the surface of the substrate and moving the pad in relation to the substrate.

Other aspects and advantages of the claimed subject matter will be apparent from the following description and the appended claims.

DETAILED DESCRIPTION

Embodiments disclosed herein relate generally to compositions and methods to polish substrates used to manufacture semiconductor devices. CMP compositions that are designed to polish metal surfaces (and some non-metal surfaces) commonly require an oxidant that facilitates the removal of the substrate during polishing by chemically oxidizing the exposed surface followed by mechanical removal of the oxidized substrate. However, the high reactivity of the oxidizing agent can cause adverse interactions/reactions with other components of a polishing composition (e.g., the abrasive and/or surfactants) leading to stability issues with the composition prior to use. For this reason, the oxidizing agent is conventionally added to the polishing composition at point-of-use (POU) immediately before the polishing composition is used in a CMP operation. The inherent reactivity of the oxidizing agent complicates operations for the end user of the polishing composition by requiring the separate purchase, storage, and addition of the oxidizing agent.

The present inventors have devised a solution to the above identified complications of conventional CMP operations that require an oxidizer by including at least one organic photocatalyst in a polishing composition. As used herein, the term "photocatalyst" refers to a compound that can be photoexcited under irradiation with photons and ultimately generate a reducing and/or oxidizing agent. In general, the photocatalyst is a non-reactive component until irradiated with photons within a wavelength range where the photocatalyst is photoexcited causing reactive intermediates to be formed in the aqueous polishing composition. Without being bound by theory, it is believed that the photoexcitation and the creation of highly reactive intermediates in the polishing composition ultimately produces an oxidizing species that can serve as an oxidizing agent during a CMP operation. Significantly, the machines that perform CMP operations are already conventionally equipped with light sources (e.g., white or red light lamps or lasers), which are used for endpoint measurements that aid in determining with high precision when a CMP operation has completed its objective. Further, because of the non-reactive nature of the photocatalyst in the absence of photoexcitation, the polishing compositions of the present application can be completely formulated for the customer and require no further additions of an oxidizer at POU. Thus, when using polishing compositions of the present disclosure (i.e., including an organic photocatalyst), there are no further modifications to the polishing compositions and potentially no further modifications necessary to the equipment used to perform the polishing, which result in savings in the cost, time, and space previously spent on the conventional oxidizing agents.

In one or more embodiments, the polishing composition described herein includes an abrasive; at least one organic photocatalyst, and an aqueous solvent (e.g., water). In one or more embodiments, a polishing composition according to the present disclosure can include from about 0.01% to about 50% by weight abrasive, about 0.0001% to about 10% by weight organic photocatalyst, and the remaining percent by weight (e.g., from about 40% to about 90% by weight) of water (e.g., deionized water). In one or more embodiments, the polishing composition can include substantially no oxidizing agent, where an oxidizing agent is defined as a substance that gains an electron from a reducing agent thereby oxidizing the reducing agent. In one or more embodiments, the oxidizing agents excluded from the composition include hydrogen peroxide, orthoperiodic acid, metaperiodic acid, dimesoperiodic acid, diorthoperiodic acid, ammonium periodate, potassium periodate, sodium periodate, ammonium persulfate, iodic acid, iodate salts, perchloric acid, perchloroate salts, hydroxylamine, or hydroxylamine salts.

In one or more embodiments, the present disclosure provides a concentrated polishing composition that can be diluted with water prior to use by up to a factor of two, or up to a factor of four, or up to a factor of six, or up to a factor of eight, or up to a factor of ten. In other embodiments, the present disclosure provides a point-of-use (POU) polishing composition for direct use on substrates without dilution.

In one or more embodiments, a POU polishing composition can include from about 0.01% to about 12% by weight abrasive, from about 0.001% to about 2% by weight organic photocatalyst, and the remaining percent by weight (e.g., from about 85% to about 99% by weight) deionized water. In one or more embodiments, a concentrated polishing composition can include from about 1% to about 50% by weight abrasive, from about 0.001% to about 10% by weight organic photocatalyst, and the remaining percent by weight (e.g., from about 40% to about 99% by weight) deionized water.

In one or more embodiments, the polishing composition described herein can include at least one (e.g., two or three) abrasive. In some embodiments, the at least one abrasive is selected from the group consisting of cationic abrasives, substantially neutral abrasives, and anionic abrasives. In one or more embodiments, the at least one abrasive is selected from the group consisting of alumina, silica, titania, ceria, zirconia, co-formed products thereof (i.e., co-formed products of alumina, silica, titania, ceria, or zirconia), coated abrasives, surface modified abrasives, and mixtures thereof. In some embodiments, the at least one abrasive does not include ceria. In one or more embodiments, the polishing composition described herein can include only one type of abrasive (e.g., silica or ceria). In some embodiments, the at least one abrasive is high-purity, and can have less than about 100 ppm of alcohol, less than about 100 ppm of ammonia, and less than about 100 parts per billion (ppb) of an alkali cation such as sodium cation. The abrasive can be present in an amount of from about 0.1% to about 12% (e.g., from about 0.5% to about 10%), based on the total weight of the POU polishing composition, or any subranges thereof.

In one or more embodiments, the at least one abrasive can have a mean particle size of from at least about 1 nm (e.g., at least about 5 nm, at least about 10 nm, at least about 20 nm, at least about 40 nm, at least about 50 nm, at least about 60 nm, at least about 80 nm, or at least about 100 nm) to at most about 1000 nm (e.g., at most about 800 nm, at most about 600 nm, at most about 500 nm, at most about 400 nm, at most about 200 nm, at most about 150 nm, or at most about 100 nm). As used herein, the mean particle size (MPS) is determined by dynamic light scattering techniques.

In one or more embodiments, the at least one abrasive is in an amount of from at least about 0.01% (e.g., at least about 0.05%, at least about 0.1%, at least about 0.5%, at least about 1%, at least about 2%, at least about 4%, at least about 5%, at least about 10%, at least about 12%, at least about 15%, or at least about 20%) by weight to at most about 50% (e.g., at most about 45%, at most about 40%, at most about 35%, at most about 30%, at most about 25%, at most about 20%, at most about 15%, at most about 12%, at most about 10%, or at most about 5%) by weight of the polishing composition described herein.

In one or more embodiments, the polishing composition described herein can include at least one (e.g., two or three) organic photocatalyst. In one or more embodiments, the polishing composition described herein can include only one organic photocatalyst. In one or more embodiments, the organic photocatalyst has an absorption max ($\lambda_{max}$) of from about 350 nm to about 850 nm. In some embodiments, the at least one organic photocatalyst has an absorption max ($\lambda_{max}$) of about 575 nm and 780 nm. The narrower absorption max range (i.e., from about 575 nm to about 780 nm) correlates roughly with the red light absorption band of the electromagnetic spectrum. Without wishing to be bound by theory, it is believed that the narrower absorption max range (i.e., from about 575 nm to about 780 nm) presents advantages over shorter wavelength (i.e., higher energy) absorption bands in that the red light used to induce the photocatalyst is low enough energy to not induce undesired reactions in other components of the polishing composition while also effectively penetrating the opaque medium of a polishing composition. In one or more embodiments, the organic photocatalyst does not contain a transition metal (e.g., Zn, Ru, Ir, or Os). Catalysts containing transition metals may possess disadvantages including their relatively higher cost than fully organic photocatalysts, potential toxicity concerns, and potential to contaminate polished surfaces with undesired contaminants.

In one or more embodiments, the organic photocatalyst is selected from the group consisting of a thiazine compound, a porphyrin compound, a thiaporphyrin compound, a phthalocyanine compound, a subphthalocyanine compound, a helical carbenium ion containing compound, and mixtures thereof. In some embodiments, the porphyrin compound is a meso-arylated porphyrin. In some embodiments, the thiazine compound is methylene blue. In some embodiments, the thiaporphyrin compound is meso-5,10,15,20-tetraphenyl-21-monothiaporphyrin (SITPP). In some embodiments, the subphthalocyanine compound can be a fluorinated subphthalocyanine compound. In some embodiments, the phthalocyanine compound is a zinc phthalocyanine compound. In some embodiments, the helical carbenium ion containing compound is dimethoxyquinacridinium (DMQA$^+$). In some embodiments, the helical carbenium ion containing compound is selected from the group consisting of N,N'-di-n-propyl-1,13-dimethoxyquinacridinium tetrafluoroborate, N,N'-di-n-propyl-1,13-dimethoxyquinacridinium chloride, N,N'-di-n-propyl-1,13-dimethoxyquinacridinium bromide, N,N'-di-n-propyl-1,13-dimethoxyquinacridinium iodide, N,N'-di-n-propyl-1,13-dimethoxyquinacridinium hydroxide, N,N'-di-n-propyl-1,13-dimethoxyquinacridinium sulfate, N,N'-di-n-propyl-1,13-dimethoxyquinacridinium borate, and N,N'-di-n-propyl-1,13-dimethoxyquinacridinium phosphate.

In one or more embodiments, the organic photocatalyst is in an amount of from about 0.0001% (e.g., at least about 0.0005%, at least about 0.001%, at least about 0.005%, at least about 0.01%, at least about 0.05%, at least about 0.1%, at least about 0.5%, at least about 1%, at least about 2%, at least about 3%, or at least about 3.5%) by weight to about 10% (e.g., at most about 8%, at most about 6%, at most about 5%, at most about 4%, at most about 3%, at most about 2%, at most about 1%, at most about 0.5%, at most about 0.1%, at most about 0.05%, or at most about 0.01%) by weight of the polishing composition described herein.

In one or more embodiments, the polishing composition described herein can include an aqueous solvent, such as water (e.g., deionized water). In some embodiments, the aqueous solvent is in an amount of from at least 40% (e.g., at least about 45%, at least about 50%, at least about 55%, at least about 60%, at least about 65%, at least about 70%, at least about 75%, at least about 80%, or at least about 85%) by weight to at most about 99% (e.g., at most about 98%, at most about 95%, at most about 90%, at most about 85%, at most about 80%, at most about 75%, at most about 70%, at most about 65%, at most about 60%, or at most about 55%) by weight of the polishing composition described herein.

In one or more embodiments, the polishing composition described herein can optionally further include at least one agent selected from the group consisting of pH adjusting agents, corrosion inhibitors (e.g., azole or non-azole corrosion inhibitors), surfactants, chelating agents, water-soluble polymers, organic acids, organic solvents, or mixtures thereof.

In one or more embodiments, the polishing composition described herein can optionally include at least one (e.g., two or three) organic acid or a salt thereof. In some embodiments, the at least one organic acid or a salt thereof are selected from the group consisting of a carboxylic acid, an amino acid, a sulfonic acid, a phosphonic acid, and salts and mixtures thereof. In more specific embodiments, the at least one organic acid is selected from the group consisting of gluconic acid, lactic acid, citric acid, tartaric acid, malic acid, glycolic acid, malonic acid, formic acid, oxalic acid, acetic acid, propionic acid, peracetic acid, succinic acid, amino acetic acid, phenoxyacetic acid, bicine, diglycolic acid, glyceric acid, tricine, alanine, histidine, valine, phenylalanine, proline, glutamine, aspartic acid, glutamic acid, arginine, lysine, glycine, arginine, tyrosine, benzoic acid, 1,2-ethanedisulfonic acid, 4-amino-3-hydroxy-1-naphthalenesulfonic acid, 8-hydroxyquinoline-5-sulfonic acid, aminomethanesulfonic acid, benzenesulfonic acid, hydroxylamine O-sulfonic acid, methanesulfonic acid, m-xylene-4-sulfonic acid, poly(4-styrenesulfonic acid), polyanetholesulfonic acid, p-toluenesulfonic acid, trifluoromethane-sulfonic acid, phosphonic acid, hydroxyethylidene diphosphonic acid, 2-phosphono-1,2,4-butane tricarboxylic acid, aminotrimethylene phosphonic acid, hexamethylenediamine tetra(methylenephosphonic acid), bis(hexamethylene)triamine phosphonic acid, ethylenediaminetetracetic acid, iminodiacetic acid, N-hydroxyethylethylenediaminetriacetic acid, nitrilotriacetic acid, diethylenetriaminepentacetic acid, hydroxyethylethylenediaminetriacetic acid, triethylenetetraaminehexaacetic acid, diaminocyclohexanetetraacetic acid, nitrilotrimethylphosphonic acid, ethylenediaminetetra (methylenephosphonic acid), 1-hydroxyl ethylidene-1,1-diphosphonic acid, diethylenetriamine penta(methylene phosphonic acid), and mixtures thereof.

In one or more embodiments, the at least one organic acid or a salt thereof is in an amount of from at least about 0.001% (e.g., at least about 0.005%, at least about 0.01%, at least about 0.05%, at least about 0.1%, at least about 0.5%, at least about 1%, at least about 1.5%, at least about 2%, at least about 2.5%, at least about 3%, or at least about 3.5%) by weight to at most about 5% (e.g., at most about 4%, at most about 3%, at most about 2%, at most about 1%, at most about 0.5%, at most about 0.1%, at most about 0.05%, or at most about 0.01%) by weight of the polishing composition described herein.

In one or more embodiments, the polishing compositions can optionally include one or more (e.g., two or three) surfactants selected from the group consisting of anionic surfactants, non-ionic surfactants, amphoteric surfactants, cationic surfactants, and mixtures thereof. The cationic surfactant is not particularly limited, but specific examples thereof include aliphatic amine salts and aliphatic ammonium salts. The non-ionic surfactant is not particularly limited, but specific examples thereof include alcohol alkoxylates, alkylphenol alkoxylates, tristyrylphenol alkoxylates, sorbitan ester alkoxylates, polyalkoxylates, polyalkylene oxide block copolymers, alkoxylated diamines, an ether-type surfactant, an ether ester-type surfactant, an ester-type surfactant, and an acetylene-based surfactant. The ether-type surfactant is not particularly limited, but specific examples thereof include polyethylene glycol mono-4-nonylphenyl ether, polyethylene glycol monooleyl ether, and triethylene glycol monododecyl ether. The ether ester-type surfactant is not particularly limited, but a specific example thereof is a polyoxyethylene ether of a glycerin ester. The ester-type surfactant is not particularly limited, but specific examples thereof include a polyethylene glycol fatty acid ester, a glycerin ester, and a sorbitan ester. The acetylene-based surfactant is not particularly limited, but specific examples thereof include ethylene oxide adducts of acetylene alcohol, acetylene glycol, and acetylene diol.

In one or more embodiments, the non-ionic surfactant is a polymer having a number average molecular weight of from at least about 500 g/mol (e.g., at least about 1,000 g/mol, at least about 2,500 g/mol, at least about 5,000 g/mol, at least about 7,500 g/mol, at least about 10,000 g/mol) to at most about 1,000,000 g/mol (e.g., at most about 750,000 g/mol, at most about 500,000 g/mol, at most about 250,000 g/mol, or at most about 100,000 g/mol). In one or more embodiments, the alkoxylate groups of the alkoxylated non-ionic surfactants are ethoxylate, propoxylate, or a combination of ethoxylate and propoxylate groups.

The amphoteric surfactant is not particularly limited, but specific examples thereof include betaine-based surfactants. The anionic surfactant is not particularly limited, but specific examples thereof include carboxylic acid salts, sulfonic acid salts, sulfate salts, and phosphate salts. The carboxylic acid salts are not particularly limited, but specific examples thereof include fatty acid salts (e.g., soaps) and alkyl ether carboxylic acid salts. Examples of the sulfonic acid salts include alkylbenzenesulfonic acid salts, alkylnaphthalenesulfonic acid salts, and α-olefin sulfonic acid salts. The sulfate salts are not particularly limited, but specific examples thereof include higher alcohol sulfate salts and alkyl sulfate salts. The phosphates are not particularly limited, but specific examples thereof include alkyl phosphates and alkyl ester phosphates.

When the polishing compositions described herein include a surfactant, the amount of the surfactant can range from at least about 0.001% (e.g., at least about 0.002%, at least about 0.003%, at least about 0.005%, at least about 0.01%, at least about 0.05%, or at least about 0.1%) by weight to at most about 1% (e.g., at most about 0.8%, at most about 0.6%, at most about 0.5%, at most about 0.4%, at most about 0.2%, or at most about 0.1%) by weight of the total mass of the polishing compositions.

In one or more embodiments, the polishing composition can optionally further include at least one (e.g., two or three) corrosion inhibitor, such as an azole corrosion inhibitor or a non-azo corrosion inhibitor. The azole corrosion inhibitor is not particularly limited, but specific examples thereof include substituted or unsubstituted triazoles (e.g., benzotriazoles), substituted or unsubstituted tetrazoles, substituted or unsubstituted diazoles (e.g., imidazoles, benzimidazoles, thiadiazoles, and pyrazoles), and substituted or unsubstituted benzothiazoles. Herein, a substituted diazole, triazole, or tetrazole refers to a product obtained by substitution of one or two or more hydrogen atoms in the diazole, triazole, or tetrazole with, for example, a carboxyl group, an alkyl group (e.g., a methyl, ethyl, propyl, butyl, pentyl, or hexyl group), a halogen group (e.g., F, Cl, Br, or I), an amino group, or a hydroxyl group. In one or more embodiments, the azole corrosion inhibitor can be selected from the group consisting of tetrazole, benzotriazole, tolyltriazole, methyl benzotriazole (e.g., 1-methyl benzotriazole, 4-methyl benzotriazole, and 5-methyl benzotriazole), ethyl benzotriazole (e.g., 1-ethyl benzotriazole), propyl benzotriazole (e.g., 1-propyl benzotriazole), butyl benzotriazole (e.g., 1-butyl benzotriazole and 5-butyl benzotriazole), pentyl benzotriazole (e.g., 1-pentyl benzotriazole), hexyl benzotriazole (e.g., 1-hexyl benzotriazole and 5-hexyl benzotriazole), dimethyl benzotriazole (e.g., 5,6-dimethyl benzotriazole), chloro benzotriazole (e.g., 5-chloro benzotriazole), dichloro benzotriazole (e.g., 5,6-dichloro benzotriazole), chloromethyl benzotriazole (e.g., 1-(chloromethyl)-1-H-benzotriazole), chloroethyl benzotriazole, phenyl benzotriazole, benzyl benzotriazole, aminotriazole, aminobenzimidazole, pyrazole, imidazole, aminotetrazole, adenine, benzimidazole, thiabendazole, 1,2,3-triazole, 1,2,4-triazole, 1-hydroxybenzotriazole, 2-methylbenzothiazole, 2-aminobenzimidazole, 2-amino-5-ethyl-1,3,4-thiadiazole, 3,5-diamino-1,2,4-triazole, 3-amino-5-methylpyrazole, 4-amino-4H-1,2,4-triazole, and combinations thereof. Without wishing to be bound by theory, it is believed that the azole corrosion inhibitor described herein can reduce the removal of certain materials (e.g., metals or dielectric materials) from a semiconductor substrate during the polishing process.

In some embodiments, the at least one azole corrosion inhibitor is in an amount of from at least about 0.001% (e.g., at least about 0.002%, at least about 0.005%, at least about 0.01%, at least about 0.02%, at least about 0.05%, at least about 0.1%, at least about 0.2%, at least about 0.5%, at least about 1%, or at least about 2%) by weight to at most about 3% (e.g., at most about 2%, at most about 1%, at most about 0.8%, at most about 0.6%, at most about 0.5%, at most about 0.4%, at most about 0.2%, at most about 0.1%, at most about 0.05%, at most about 0.02%, at most about 0.01%, or at most about 0.005%) by weight of the polishing composition described herein.

In some embodiments, the polishing compositions described herein can optionally include at least one (e.g., two or three) non-azole corrosion inhibitor. Examples of non-azole corrosion inhibitors include C2-C18 alkylamines (e.g., ethylamine, propylamine, butylamine, dodecylamine, etc.) and organic phosphonic acids (e.g., ethylphosphonic acid).

In some embodiments, the at least one non-azole corrosion inhibitor can be from at least about 0.001% (e.g., at least about 0.002%, at least about 0.004%, at least about 0.005%, at least about 0.006%, at least about 0.008%, at least about 0.01%, at least about 0.02%, at least about 0.04%, at least about 0.05%, at least about 0.06%, at least about 0.08%, at least about 0.1%, or at least about 0.5%) by weight to at most about 2% (e.g., at most about 1.5%, at most about 1%, at most about 0.5%, at most about 0.1%, at most about 0.05%, at most about 0.04%, at most about 0.03%, at most about 0.02%, or at most about 0.01%) by weight of the polishing compositions described herein.

In one or more embodiments, the polishing composition may further include a chelating agent. In one or more embodiments, the chelating agent can be selected from the group consisting of gluconic acid, lactic acid, citric acid, tartaric acid, malic acid, glycolic acid, malonic acid, formic acid, oxalic acid, acetic acid, propionic acid, peracetic acid, succinic acid, amino acetic acid, phenoxyacetic acid, bicine, diglycolic acid, glyceric acid, tricine, alanine, histidine, valine, phenylalanine, proline, glutamine, aspartic acid, glutamic acid, arginine, lysine, tyrosine, benzoic acid, ammonia, 1,2-ethanedisulfonic acid, 4-amino-3-hydroxy-1-naphthalenesulfonic acid, 8-hydroxyquinoline-5-sulfonic acid, aminomethanesulfonic acid, benzenesulfonic acid, hydroxylamine O-sulfonic acid, methanesulfonic acid, m-xylene-4-sulfonic acid, poly(4-styrenesulfonic acid), polyanetholesulfonic acid, p-toluenesulfonic acid, trifluoromethanesulfonic acid, salts thereof, and mixtures thereof. Without wishing to be bound by theory, it is believed that the chelating agent can serve as a removal rate enhancer to facilitate removal of certain materials on a substrate.

In some embodiments, the chelating agent can be from at least about 0.1% (e.g., at least about 0.2%, at least about 0.3%, at least about 0.4%, at least about 0.5%, at least about 0.6%, at least about 0.7%, at least about 0.8%, at least about 0.9%, or at least about 1%) by weight to at most about 10% (e.g., at most about 8%, at most about 6%, at most about 5%, at most about 4%, at most about 2%, at most about 1%, at most about 0.8%, at most about 0.6%, or at most about 0.5%) by weight of the polishing compositions described herein.

In one or more embodiments, the polishing composition can optionally further include at least one (e.g., two or three) water-soluble polymer. The water-soluble polymer is not particularly limited, but specific examples thereof include polyacrylamide, polyvinyl alcohol, polyvinylpyrrolidone, polyacrylic acid, and hydroxyethyl cellulose. Without wishing to be bound by theory, it is believed that the water-soluble polymer can serve as a removal rate inhibitor to reduce the removal rate of certain exposed materials on a substrate that do not intend to be removed or should be removed at a lower removal rate during the polishing process.

In some embodiments, the at least one water-soluble polymer can be from at least about 0.01% (e.g., at least about 0.02%, at least about 0.03%, at least about 0.04%, at least about 0.05%, at least about 0.06%, at least about 0.07%, at least about 0.08%, at least about 0.09%, or at least about 0.1%) by weight to at most about 1% (e.g., at most about 0.8%, at most about 0.6%, at most about 0.5%, at most about 0.4%, at most about 0.2%, at most about 0.1%, at most about 0.08%, at most about 0.06%, or at most about 0.05%) by weight of the polishing compositions described herein.

In one or more embodiments, the polishing composition can optionally further include at least one (e.g., two or three) organic solvent. In one or more embodiments, the organic solvent can be used in the POU or concentrated polishing composition of the present disclosure. In one or more embodiments, the organic solvent can be a water-soluble organic solvent. As used herein, a "water-soluble" substance (e.g., a water-soluble solvent) refers to a substance having a solubility of at least 1% by weight in water at 25° C. In one or more embodiments, the at least one organic solvent can have a polarity index of from at least about 2 (e.g., at least about 3, at least 4, or at least about 5) to at most about 10 (e.g., at most about 9, at most about 8, at most about 7, at most about 6, or at most about 5). In one or more embodiments, the at least one organic solvent can be one or more alcohols, alkylene glycols, ethers (e.g., alkylene glycol ethers), esters, ketones, nitriles, sulfoxides, urethanes, ureas, amines (e.g., alkanolamines), amides, carbonyls, carbonates, aromatic hydrocarbons, or halogenated hydrocarbons. In one or more embodiments, the at least one organic solvent includes one or more solvents selected from the group consisting of methanol, ethanol, 1-propanol, 2-propanol, 1-butanol, 2-butanol, t-butyl alcohol, 1-pentanol, 2-pentanol, 3-pentanol, cyclohexanol, ethylene glycol, propylene glycol, 2-methoxyethanol, 2-ethoxyethanol, 2-propoxyethanol, 2-isopropoxyethanol, 2-butoxyethanol, propylene glycol methyl ether, propylene glycol propyl ether, diethylene glycol butyl ether, ethylene glycol dimethyl ether, ethylene glycol diethyl ether, acetone, acetonitrile, dimethyl sulfoxide, dimethylformamide, dimethylacetamide, tetrahydrofuran, 1-methyl-2-pyrrolidone, 3-methyl-2-oxazolidinone, N,N'-dimethylimidazolidinone, ethylene carbonate, propylene carbonate, glycerol, diethylene glycol, diglyme, dioxane, morpholine, butanone, 2-pentanone, 3-pentanone, monoethanolamine, 2-(2-aminoethoxy)ethanol, 2-amino-2-methyl-1,3-propanediol, 2-amino-2-hydroxymethyl-propane-1,3-diol, piperazine, 1-(2-hydroxyethyl)piperazine, and any mixtures thereof.

In some embodiments, the at least one organic solvent is in an amount of from at least about 0.001% (e.g., at least about 0.005%, at least about 0.01%, at least about 0.05%, at least about 0.1%, at least about 0.5%, at least about 1%, at least about 1.5%, at least about 2%, at least about 2.5%, at least about 3%, or at least about 3.5%) by weight to at most about 5% (e.g., at most about 4%, at most about 3%, at most about 2%, at most about 1%, at most about 0.5%, at most about 0.1%, at most about 0.05%, or at most about 0.01%) by weight of the polishing composition described herein.

In one or more embodiments, the polishing composition described herein can optionally include at least one (e.g., two or three) pH adjusting agent (e.g., an acid or a base). In some embodiments, the at least one pH adjusting agent is selected from the group consisting of hydrochloric acid, sulfuric acid, phosphoric acid, nitric acid, ammonium hydroxide, sodium hydroxide, potassium hydroxide, cesium hydroxide, monoethanolamine, diethanolamine, triethanolamine, methylethanolamine, methyldiethanolamine, tetrabutylammonium hydroxide, tetrapropylammonium hydroxide, tetraethylammonium hydroxide, tetramethylammonium hydroxide, ethyltrimethylammonium hydroxide, diethyldimethylammonium hydroxide, dimethyldipropylammonium hydroxide, benzyltrimethylammonium hydroxide, tris(2-hydroxyethyl)methylammonium hydroxide, choline hydroxide, and any combinations thereof.

In one or more embodiments, the at least one pH adjusting agent is in an amount of from at least about 0.01% (e.g., at least about 0.05%, at least about 0.1%, at least about 0.5%, at least about 1%, or at least about 1.5%) by weight to at most about 2% (e.g., at most about 1.5%, at most about 1%, at most about 0.5%, at most about 0.2%, or at most about 0.1%) by weight of the polishing composition described herein.

In one or more embodiments, the polishing composition described herein can be either acidic or basic. In some embodiments, the pH value of the polishing composition can range from at least about 2 (e.g., at least about 2.5, at least about 3, at least about 3.5, at least about 4, at least about 4.5, at least about 5, at least about 5.5, at least about 6, at least about 6.5, at least about 7, at least about 7.5, at least about 8, at least about 8.5, at least about 9, at least about 9.5, at least about 10, at least about 10.5, at least about 11, at least about 11.5, or at least about 12) to at most about 13 (e.g., at most about 12.5, at most about 12, at most about 11.5, at most about 11, at least about 10.5, at most about 10, at most about 9.5, at most about 9, at most about 8.5, at most about 8, at most about 7.5, at most about 7, at most about 6.5, at most about 6, at most about 5.5, at most about 5, at most about 4.5, at most about 4, at most about 3.5, at most about 3, or at most about 2.5). In order to obtain the desired pH, the relative concentrations of the ingredients in the polishing compositions described herein can be adjusted.

In one or more embodiments, the polishing composition described herein can be substantially free of one or more of certain ingredients, such as organic solvents, pH adjusting agents, quaternary ammonium compounds (e.g., salts such as tetraalkylammonium salts and hydroxides such as tetraalkylammonium hydroxides (e.g., tetramethylammonium hydroxide)), alkali bases (such as alkali hydroxides), fluorine-containing compounds (e.g., fluoride compounds or fluorinated compounds (such as fluorinated polymers/surfactants)), silicon-containing compounds such as silanes (e.g., alkoxysilanes), nitrogen containing compounds (e.g., amino acids, amines, imines (e.g., amidines such as 1,8-diazabicyclo[5.4.0]-7-undecene (DBU) and 1,5-diazabicyclo[4.3.0]non-5-ene (DBN)), amides, or imides), salts (e.g., halide salts or metal salts), polymers (e.g., non-ionic, cationic, anionic, or water-soluble polymers), inorganic acids (e.g., hydrochloric acid, sulfuric acid, phosphoric acid, or nitric acid), surfactants (e.g., cationic surfactants, anionic surfactants, or non-ionic surfactants), plasticizers, oxidizing agents (e.g., hydrogen peroxide and periodic acid), corrosion inhibitors (e.g., azole or non-azole corrosion inhibitors), electrolytes (e.g., polyelectrolytes), and/or certain abrasives (e.g., polymer abrasives, fumed silica, ceria abrasives, non-ionic abrasives, surface modified abrasives, negatively/positively charged abrasives, or ceramic abrasive composites). The halide salts that can be excluded from the polishing compositions include alkali metal halides (e.g., sodium halides or potassium halides) or ammonium halides (e.g., ammonium chloride), and can be fluorides, chlorides, bromides, or iodides. As used herein, an ingredient that is "substantially free" from a polishing composition refers to an ingredient that is not intentionally added into the polishing composition. In some embodiments, the polishing composition described herein can have at most about 1000 ppm (e.g., at most about 500 ppm, at most about 250 ppm, at most about 100 ppm, at most about 50 ppm, at most about 10 ppm, or at most about 1 ppm) of one or more of the above ingredients that are substantially free from the polishing composition. In some embodiments, the polishing compositions described herein can be completely free of one or more of the above ingredients.

The present disclosure also contemplates a method of using any of the above-described polishing compositions (e.g., concentrates or POU slurries). With the concentrate, the method can comprise the steps of diluting the concentrate to form a POU slurry (e.g., by a factor of at least two), and then contacting a substrate surface with the POU slurry. With the POU slurry, the method comprises the step of contacting the substrate surface with the slurry.

In one or more embodiments, this disclosure features a polishing method that can include applying a polishing composition according to the present disclosure to a substrate (e.g., a wafer); and bringing a pad into contact with the surface of the substrate and moving the pad in relation to the substrate. In one or more embodiments, the polishing method can further include illuminating the substrate with a light source (e.g., a lamp or a laser) during moving the pad in relation to the substrate. In one or more embodiments, the light source can include light having a wavelength from about 350 nm to about 850 nm. In one or more embodiments, the light source can include light having a wavelength from about 575 nm to about 780 nm.

In some embodiments, the substrate can include a metal. In one or more embodiments, the metal can include copper, cobalt, ruthenium, molybdenum, titanium and doped derivatives thereof, tungsten and doped derivatives thereof (e.g., WCN and $WB_4$), tantalum and doped derivatives thereof, or a combination thereof. In one or more embodiments, the substrate can include a non-metal. For example, the non-metal substrate may be a metal oxide (e.g. silicon oxide or a "spin on oxide") or a polymeric material (e.g., a "carbon hard mask").

In one or more embodiments, the substrate can optionally include carbides (e.g., BC, $B_4C$, TiC, SiC, and WC), boron-containing materials (e.g., $B_6O$, $BC_2N$, and $AlMgB_{14}$), nitride ceramic materials (e.g., SiN, TiN, and BN), barrier materials (e.g., Ti, TiN, WCN, Ta and TaN), and dielectric materials (e.g., TEOS, low-k materials, and ultra low-k materials).

It is to be noted that the term "silicon oxide" described herein is expressly intended to include both un-doped and doped versions of silicon oxide. For example, in one or more embodiments, the silicon oxide can be doped with at least one dopant selected from carbon, nitrogen, hydrogen, phosphorous, boron, or any other known dopants for silicon oxide. Some examples of silicon oxide film types include TEOS (tetra-ethyl orthosilicate), SiOC, SiOCN, SiOCH, SiOH, and SiON.

In some embodiments, the method that uses a polishing composition described herein can further include forming or producing a semiconductor device from the substrate treated by the polishing composition through one or more steps. For example, photolithography, ion implantation, dry/wet etching, plasma etching, deposition (e.g., PVD, CVD, ALD, and ECD), wafer mounting, die cutting, packaging, and testing can be used to produce a semiconductor device from the substrate treated by the polishing composition described herein.

Example 1

The general compositions used in this example are shown in Table 1 below.

TABLE 1

| Component | % By Weight of Composition |
| --- | --- |
| pH adjusting agent (base) | 0.05-5% |
| Organic Photocatalyst (if used) | 0.0001-1% |
| Azole Compound (if used) | 0.001-0.5% |
| Abrasive (silica) | 0.1-12% |
| Solvent (DI Water) | 78-99% |
| pH | 7-10 |

A series of polishing compositions are produced and are tested to evaluate their performance in polishing a copper blanket wafer both with illumination (wavelength between 350 nm to about 850 nm) and without illumination during the polishing in an AMAT Reflexion CMP instrument. The samples are all prepared according to Table 1 above and include the same amount of each component except for the differences detailed in Table 2 below. If used, the organic photocatalyst is a helical carbenium ion containing compound.

TABLE 2

| Sample | |
| --- | --- |
| 1 | No organic photocatalyst or azole compound |
| 2 | Includes organic photocatalyst but no azole compound |
| 3 | Includes organic photocatalyst and azole compound |

All three samples shown in Table 2 are expected to produce a relatively similar and low copper removal rate (e.g., less than 100 Å/min) when they are used to polish a copper blanket wafer without illumination as only mechanical polishing will take place. As there is no organic photocatalyst in Sample 1, the copper removal rate of this sample with illumination will be similar to the copper removal rate without illumination. Sample 2 and Sample 3 will have a much greater copper removal rate (e.g., 100 Å/min-3000 Å/min) when they are used to polish a copper blanket wafer under illumination compared to when they are used to polish the same wafer without illumination, as the illumination will activate the organic photocatalyst to produce oxidizing species during the polishing. The copper removal rate under illumination for Sample 3 will be lower than that for Sample 2 as the azole corrosion inhibitor will modulate the ability of the oxidizing species to chemically react with the copper surface. Further, compared to Sample 1, Sample 2 and Sample 3 will have a much greater copper removal rate under illumination due to their inclusion of an organic photocatalyst.

Although only a few embodiments have been described in detail above, those skilled in the art will readily appreciate that many modifications are possible in the embodiments without materially departing from this invention. Accordingly, all such modifications are intended to be included within the scope of this disclosure as defined in the following claims.

What is claimed is:

1. A polishing composition, comprising:
   at least one abrasive;
   at least one organic photocatalyst, wherein the organic photocatalyst is a helical carbenium ion containing compound; and
   water.

2. The polishing composition of claim 1, wherein the helical carbenium ion containing compound is selected from the group consisting of dimethoxyquinacridinium (DMQA+), N,N'-di-n-propyl-1,13-dimethoxyquinacridinium tetrafluoroborate, N,N'-di-n-propyl-1,13-dimethoxyquinacridinium chloride, N,N'-di-n-propyl-1,13-dimethoxyquinacridinium bromide, N,N'-di-n-propyl-1,13-dimethoxyquinacridinium iodide, N,N'-di-n-propyl-1,13-dimethoxyquinacridinium hydroxide, N,N'-di-n-propyl-1,13-dimethoxyquinacridinium sulfate, N,N'-di-n-propyl-1,13-dimethoxyquinacridinium borate, and N,N'-di-n-propyl-1,13-dimethoxyquinacridinium phosphate.

3. The polishing composition of claim 1, wherein the at least one abrasive is selected from the group consisting of alumina, silica, titania, ceria, zirconia, co-formed products of alumina, silica, titania, ceria, or zirconia, coated abrasives, surface modified abrasives, and mixtures thereof.

4. The polishing composition of claim 1, wherein the at least one abrasive is in an amount of from about 0.01% to about 50% by weight of the composition.

5. The polishing composition of claim 1, wherein the organic photocatalyst has an absorption max ($\lambda$max) of from about 350 nm to about 850 nm.

6. The polishing composition of claim 1, wherein the organic photocatalyst does not contain a transition metal.

7. The polishing composition of claim 1, wherein the organic photocatalyst is in an amount of from about 0.0001% to about 10% by weight of the composition.

8. The polishing composition of claim 1, wherein the polishing composition does not include hydrogen peroxide, orthoperiodic acid, metaperiodic acid, dimesoperiodic acid, diorthoperiodic acid, ammonium periodate, potassium periodate, sodium periodate, ammonium persulfate, iodic acid, an iodate salt, perchloric acid, a perchloroate salt, hydroxylamine, or a hydroxylamine salt.

9. The polishing composition of claim 1, further comprising at least one compound selected from the group consisting of pH adjusting agents, corrosion inhibitors, surfactants, chelating agents, water-soluble polymers, organic acids, organic solvents, or mixtures thereof.

10. A method, comprising:
   applying the polishing composition of claim 1 to a substrate; and bringing a pad into contact with the surface of the substrate and moving the pad in relation to the substrate.

11. The method of claim 10, wherein the at least one abrasive is selected from the group consisting of alumina, silica, titania, ceria, zirconia, co-formed products of alumina, silica, titania, ceria, or zirconia, coated abrasives, surface modified abrasives, and mixtures thereof.

12. The method of claim 10, wherein the at least one abrasive is in an amount of from about 0.01% to about 50% by weight of the composition.

13. The method of claim 10, wherein the organic photocatalyst has an absorption max ($\lambda$max) of from about 350 nm to about 850 nm.

14. The method of claim 10, wherein the organic photocatalyst does not contain a transition metal.

15. The method of claim 10, wherein the organic photocatalyst is in an amount of from about 0.0001% to about 10% by weight of the composition.

16. The method of claim 10, wherein the polishing composition does not include hydrogen peroxide, orthoperiodic acid, metaperiodic acid, dimesoperiodic acid, diorthoperiodic acid, ammonium periodate, potassium periodate, sodium periodate, ammonium persulfate, iodic acid, an iodate salt, perchloric acid, a perchloroate salt, hydroxylamine, or a hydroxylamine salt.

17. The method of claim 10, further comprising at least one compound selected from the group consisting of pH adjusting agents, corrosion inhibitors, surfactants, chelating agents, water-soluble polymers, organic acids, organic solvents, or mixtures thereof.

18. The method of claim 10, further comprising illuminating the substrate with a light source during the moving of the pad in relation to the substrate.

19. The method of claim 10, further comprising forming a semiconductor device from the substrate.

* * * * *